United States Patent [19]

Ohtake

[11] Patent Number: 4,555,876
[45] Date of Patent: Dec. 3, 1985

[54] PROCESS AND APPARATUS FOR FINISHING ELECTRONIC DEVICE

[75] Inventor: Matsuo Ohtake, Numazu, Japan

[73] Assignee: Fuji Seiki Machine Works, Ltd., Sunto, Japan

[21] Appl. No.: 492,299

[22] Filed: May 6, 1983

[30] Foreign Application Priority Data

Mar. 13, 1982 [JP] Japan .................. 57-038874

[51] Int. Cl.⁴ .................. B24C 3/08; B65G 57/30
[52] U.S. Cl. .................. 51/418; 51/413; 51/215 UE; 414/32; 414/47; 414/96; 414/131
[58] Field of Search .................. 51/319–321, 51/410, 413, 417–418, 426, 215 M, 215 H, 215 UE; 414/32, 37, 47, 96, 131, 120

[56] References Cited

U.S. PATENT DOCUMENTS

| | | | |
|---|---|---|---|
| 3,360,100 | 12/1967 | Seragnoli | 414/96 X |
| 3,771,670 | 11/1973 | Napoleone et al. | 414/96 |
| 4,008,890 | 2/1977 | Pulda | 414/32 X |
| 4,068,767 | 1/1978 | Tippetts | 414/32 |
| 4,195,961 | 4/1980 | Waiblinger | 414/120 |
| 4,390,098 | 6/1983 | Wilgus et al. | 414/96 X |

FOREIGN PATENT DOCUMENTS

55-74162  3/1980  Japan .
56-17167  2/1981  Japan .

OTHER PUBLICATIONS

Electronic Packaging and Production Article, Nov. 1980, pp. 147–148.
Fuji Seiki Catalog LH-16T and accompanying descriptive pages P6 to P8.

*Primary Examiner*—Frederick R. Schmidt
*Assistant Examiner*—Debra S. Meislin
*Attorney, Agent, or Firm*—Flynn, Thiel, Boutell & Tanis

[57] ABSTRACT

A machine for finishing lead frames for integrated circuits, including a first rotatable turntable, and a plurality of first cassettes mounted thereon in angularly spaced relationship, each first cassette supporting a plurality of frames in vertically stacked relationship; a second rotatable turntable disposed a selected distance from the first turntable, and a plurality of second cassettes mounted on the second turntable in angularly spaced relationship, each second cassette accommodating a plurality of frames in vertically stacked relationship; a horizontally elongated transfer device extending from tangentially adjacent the first turntable to tangentially adjacent the second turntable for moving individual frames therebetween; a blasting chamber associated with the transfer device for subjecting the frames to a blasting media; a first mechanism for transferring frames from the first cassette onto the upstream end of the transfer device; and a second mechanism for transferring the frames from the downstream end of the transfer device into the second cassette.

2 Claims, 18 Drawing Figures

PROCESS AND APPARATUS FOR FINISHING ELECTRONIC DEVICE

FIELD OF THE INVENTION

This invention relates to a process and apparatus for the continuous finishing of an electronic device and, in particular, to a process and apparatus for removing resin burrs or flash from the lead frame of an integrated circuit.

BACKGROUND OF THE INVENTION

When forming a microprocessor or integrated circuit (commonly referred to as a "chip"), there is provided a metal plate having a plurality of leads formed therein. Thereafter a mass of synthetic resin is molded on the plate in association with the leads so that the leads project therefrom, following which the plate is cut to separate the free ends of the leads therefrom and hence result in the finished chip. Such chip is well known. FIG. 1 illustrates a completed chip having a molded resin mass c and leads a and b projecting therefrom, which leads are normally bent downwardly in parallel relationship. FIG. 2 illustrates the forming of several such chips on a single metal plate L, which plate is conventionally referred to as a "lead frame".

During molding of the resin mass c around the leads a and b when the latter are still fixedly and integrally associated with the lead frame L, the molding process invariably results in the formation of resin burrs or flash at the interface of the metal and resin mass, such as at d. Since this flash or burr is in the vicinity of the leads, it must be removed, and for this purpose removal is oftentimes effected by dry or wet blasting processes. In such processes, the surface of the molded part is blasted and abraded by small particles. Thus, most processes utilize a case for covering critical portions of the lead frame, specifically the molded mass c to prevent blasting and abrasion thereof, whereas other areas of the case are provided with suitable openings so that the blasting material can contact and remove the flash and burrs. However, recent developments with respect to the blasting media have resulted in the development of a new kind of blasting media which can remove the resin burr and flash without abrading the surface of the molded mass c, and hence by use of this blasting media, the lead frame can be subject to the blasting process without requiring use of a protective case.

The handling of the lead frames both before and after the blasting process has been an inefficient and time consuming procedure, often involving substantial manual manipulation. The lead frames are individually and sequentially subjected to the blasting process by means of a known apparatus employing a conveyor which sequentially feeds the lead frames through a blasting chamber, such apparatus being disclosed in Japanese published application No. 53-145965 as owned by the Assignee of this application.

Accordingly, it is an object of this invention to provide an improved process and apparatus for automatically removing resin burrs and flash from the lead frame by use of a blasting process, which process and apparatus permits the continuous and automatic mechanical handling of the lead frame for supply into, through and out of the blasting stage of the apparatus.

More specifically, it is an object of this invention to provide a process and apparatus, as aforesaid, which permits a plurality of lead frames to be supplied to the apparatus within a vertical stack as confined within a holder or cassette. The apparatus includes a loading mechanism which permits the individual lead frames to be supplied sequentially one at a time from a cassette into and through the blasting chamber, and an unloading mechanism which sequentially vertically stacks the lead frames one above the other within another cassette or holder. The holders or cassettes at both the input and output ends of the blasting chamber are preferably mounted on turntables which each hold a plurality of cassettes and which index sequentially to permit emptying or filling of cassettes, whereupon individual lead frames can be sequentially and automatically supplied from the supply turntable to the blasting conveyor for passage through the blasting chamber, and then individually discharged therefrom and transferred into one of the cassettes on the discharge turntable in a sequential and wholly mechanical fashion, thereby permitting a large number of lead frames to be efficiently and rapidly handled wholly mechanically and automatically.

The present invention, in a preferred embodiment, comprises a machine for removing resin burrs or flash from lead frames, which machine permits blasting of the lead frames continuously one after another while permitting the lead frames to be automatically and mechanically supplied from a plurality of cassettes each containing a stack of lead frames therein, with the lead frames after blasting being individually resupplied to and stacked within a plurality of individual cassettes. The machine includes a supply or loading apparatus in the form of a rotatable table having a plurality of cassettes spaced angularly therearound, each cassette being adapted to support a stack of lead frames therein. The table is rotatably indexed such that one of the cassettes is disposed adjacent one end of a conveyor system, whereupon a transfer mechanism sequentially discharges the lower-most lead frame from the cassette onto the upstream end of the conveyor system, which conveyor system then moves the lead frames sequentially through the blasting chamber. A removal or unloading apparatus in the form of a rotatable table having a plurality of angularly-spaced cassettes thereon is disposed adjacent the other end of the conveyor system, and a further transfer mechanism sequentially removes the finished lead frames and loads them into one of these latter cassettes.

Other objects and purposes of the invention will be apparent upon reading the following specification and inspecting the accompanying drawings.

Figure 1:
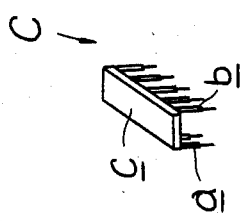
FIG. 1 is a perspective view of a conventional integrated circuit or microprocessor chip.

Certain terminology will be used in the following description for convenience in reference only, and will not be limiting. For example, the words "upwardly", "downwardly", "rightwardly" and "leftwardly" will refer to directions in the drawings to which reference is made. The word "forward" will refer to the normal direction of movement of the lead frame through the machine, which direction is from left to right in FIGS. 3 and 4. The words "inwardly" and "outwardly" will refer to directions toward and away from, respectively, the geometric center of the machine and designated parts thereof. Said terminology will include the words specifically mentioned, derivatives thereof, and words of similar import.

DETAILED DESCRIPTION

Figure 2:
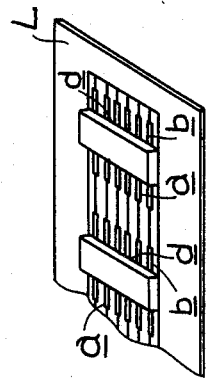
FIG. 2 is a fragmentary perspective view illustrating several such chips during formation thereof on a lead frame.
Figure 3:
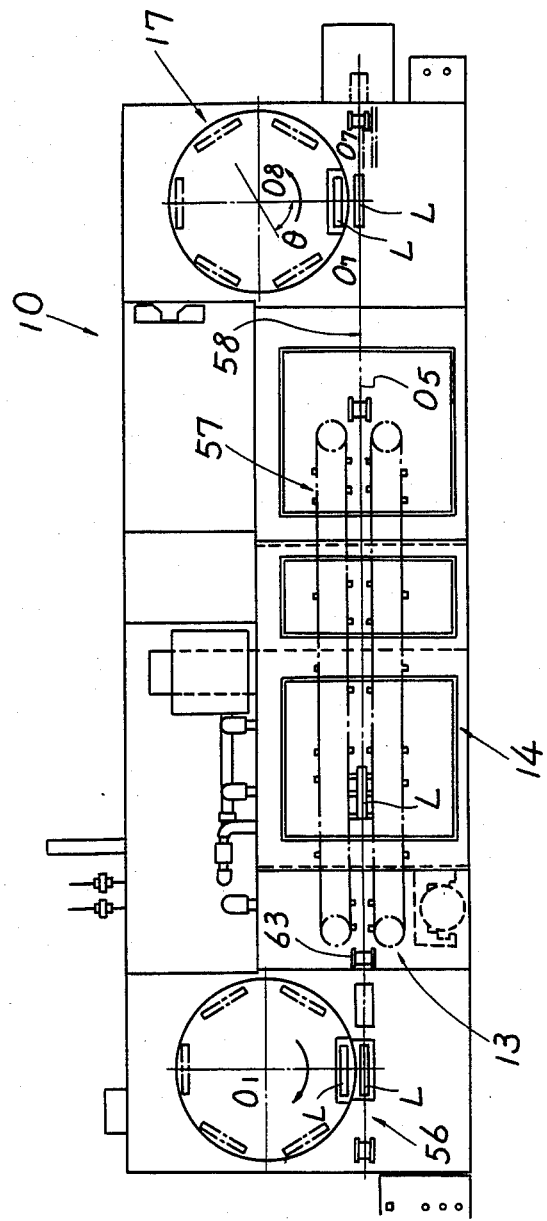
FIG. 3 is a top view of the machine embodying the invention.
Figure 4:
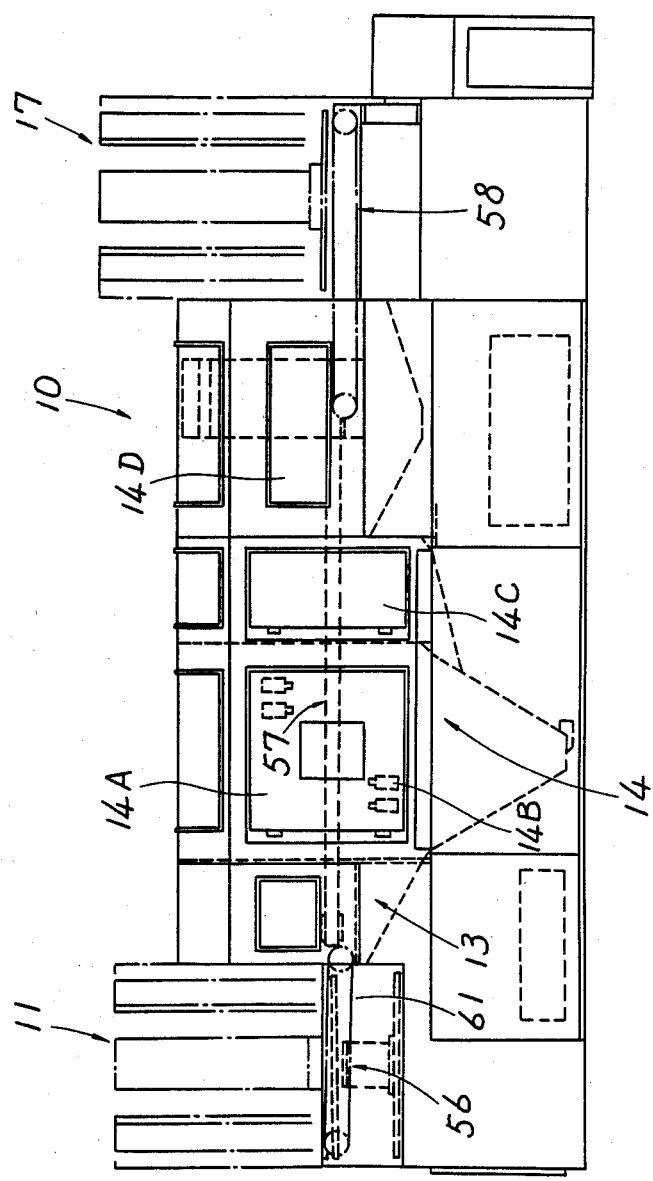
FIG. 4 is a side elevational view of the machine shown in FIG. 3.

Referring to FIGS. 3 and 4, there is illustrated a machine 10 according to the present invention for handling lead frames L of the type illustrated by FIG. 2.

The machine 10 includes, at the input end thereof, a supply or loading apparatus 11 for the lead frames L. A transfer mechanism 12 transfers the lead frames L individually and sequentially from the supply apparatus 11 to the input end of a conveyor system 13, which system individually and sequentially feeds the frames L through a blasting apparatus 14 to effect removal of burrs and flash. A further transfer mechanism 16 is disposed adjacent the output end of the conveyor system 13 to individually and sequentially transfer the finished lead frames onto a removal or unloading apparatus 17, on which apparatus the finished lead frames are stored in vertically stacked relationship within removable holders or cassettes.

The blasting apparatus 14 is conventional in that it includes a blasting chamber 14A in which are positioned a plurality of blasting guns 14B disposed for directing streams of blasting media against both the upper and lower sides of the lead frames as they horizontally move through the blasting chamber. The blasting streams are preferably liquid-abrasive mixtures. The lead frames pass from the blasting chamber into a washing chamber 14C, and thence into a rinsing chamber 14D.

Considering the supply or loading apparatus 11, same includes a substantially horizontally planar turntable 21 rotatably supported on a stationary frame 22, whereby the turntable 21 is rotatable about its central vertical axis $O_1$. The turntable is rotatably indexed about this axis as described hereinafter. A plurality of cassettes or holders 23 are supported on and project upwardly from the upper surface of turntable 21. These cassettes 23 are positioned in close proximity to the periphery of the table 21 and are uniformly angularly spaced therearound.

Figure 5:
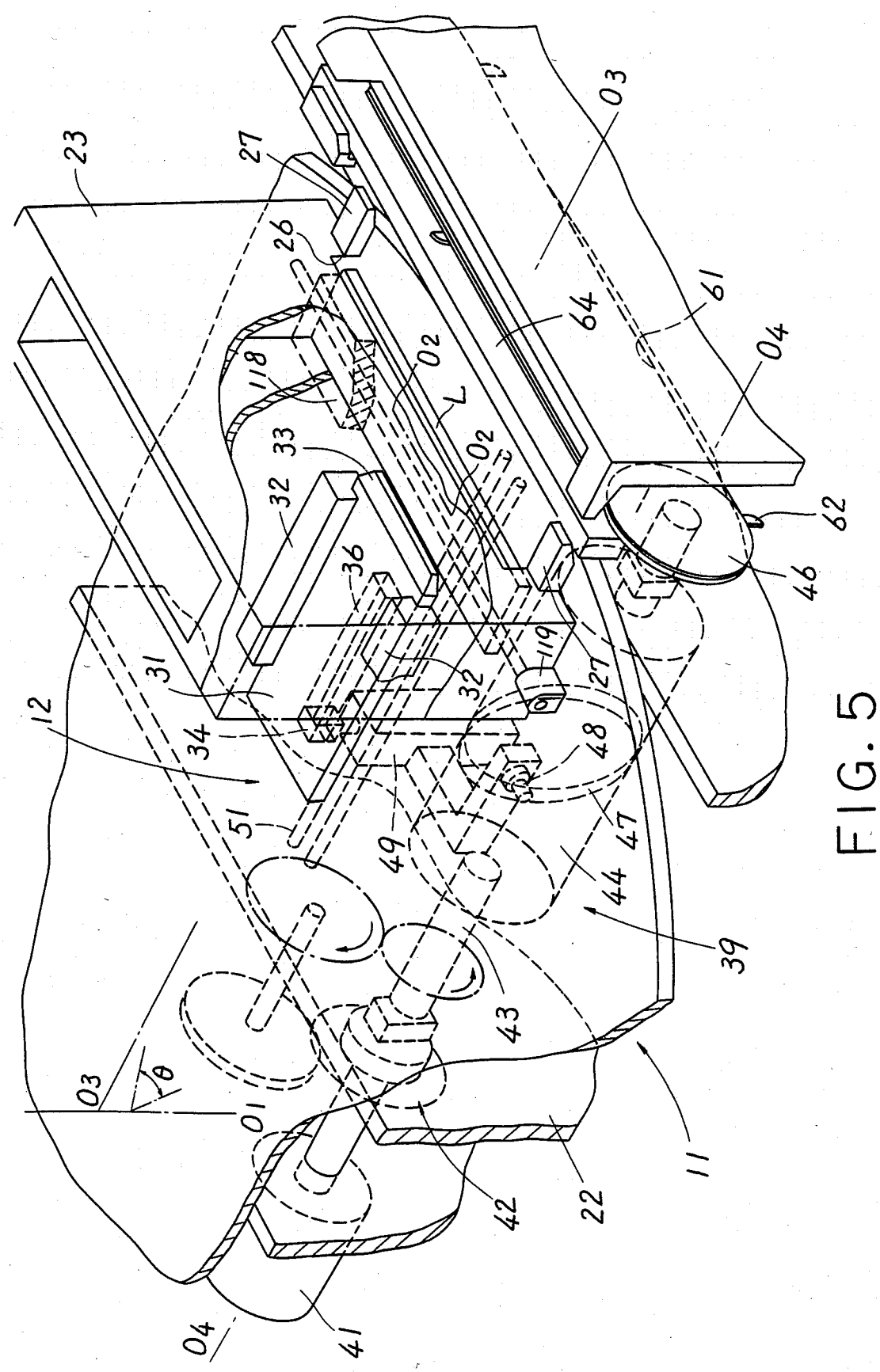
FIG. 5 is a fragmentary perspective view illustrating the transfer mechanism which cooperates between the supply turntable and the upstream end of the conveyor system.

The cassette 23, as illustrated by FIG. 5, comprises a substantially upright tubular element having an opening or chamber 24 extending vertically therethrough, which chamber 24 is closed at its lower end by means of the turntable 21. This chamber 24 is of a substantially rectangular horizontal cross section and has a size and configuration which closely conforms to but only slightly exceeds the rectangular dimensions of the lead frame L so as to permit a plurality of identical such lead frames L to be vertically stacked and supported within the cassette 23. The cassette 23 is positioned such that the lengthwise central horizontal axis of chamber 24 extends along the line $O_2$, which line $O_2$ effectively defines a cord of the turntable and is perpendicular to a line $O_3$ which extends radially of the turntable and passes through its rotational axis $O_1$. This radial line $O_3$ passes through the midpoint of the horizontal cross section of the cassette opening 24.

The cassette 23 has, at the lower end thereof, an elongated slit or slot 26 extending through the front side wall thereof, which slot 26 aligns with a pair of substantially parallel guide elements 27 which are fixed on the upper surface of the table 21 and project to the free edge thereof. The width of slot 26 and the spacing between guide elements 27 is such as to be slightly greater than the length of the lead frame L so as to permit the latter to be slidably and guidably displaced. The slot 26 has a height which only slightly exceeds the height of a single lead frame so as to permit the lead frames to be sidewardly and individually displaced from the bottom of the cassette.

Figure 6:
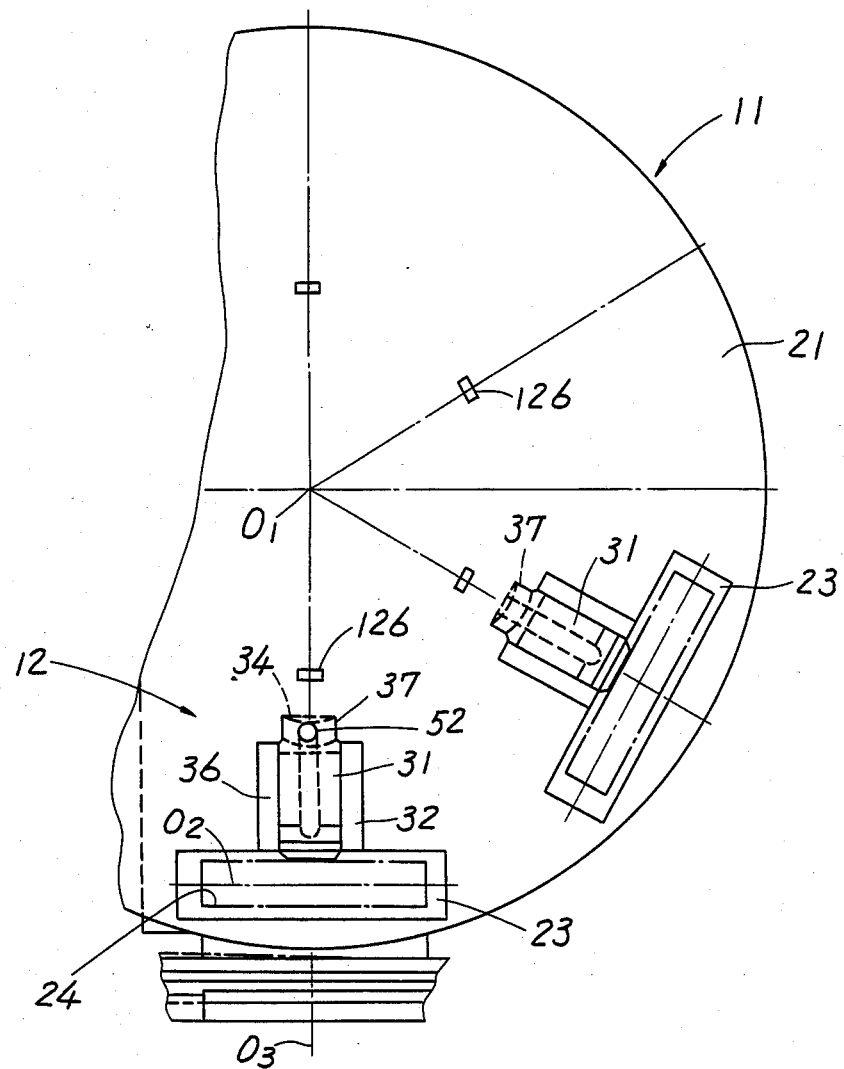
FIG. 6 is a fragmentary top view of the structure illustrated by FIG. 5.
Figure 7:
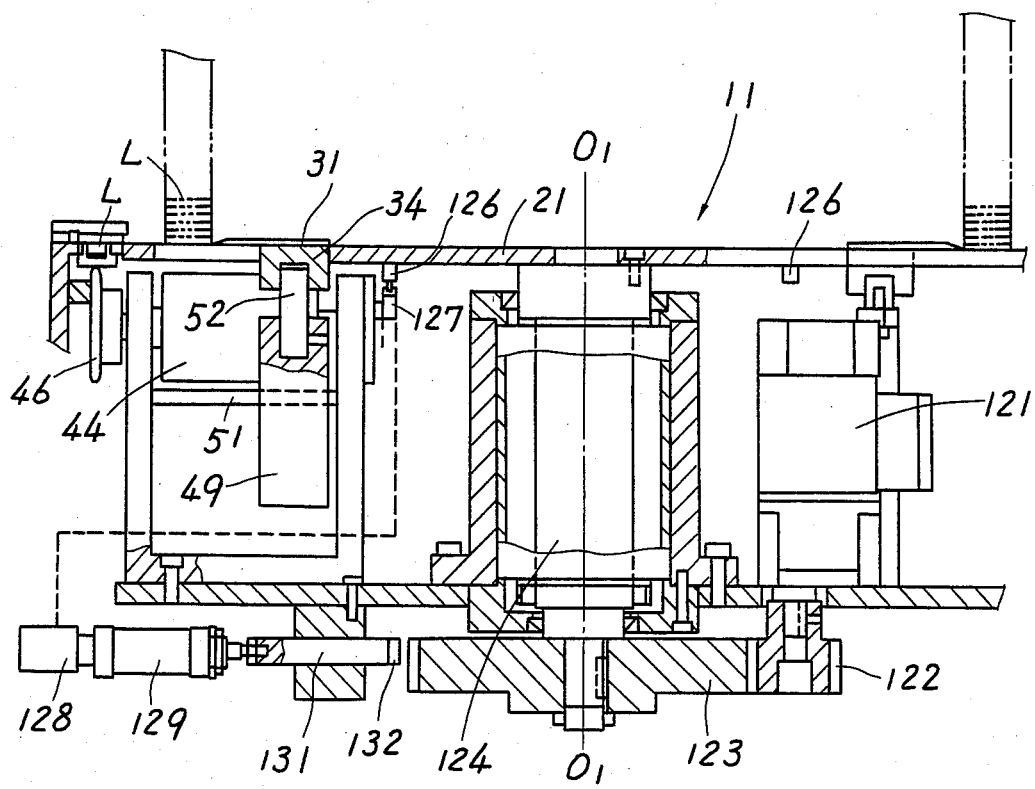
FIG. 7 is a fragmentary central sectional view through the supply turntable.

To permit unloading of the lead frames L from the bottom of cassette 23, there is provided the transfer mechanism 12 as illustrated by FIGS. 5–7. This mechanism includes a pusher plate 31 associated with each cassette 23. This pusher plate 23 is disposed directly radially inwardly from the respective cassette 23, and is radially slidably supported on the turntable for displacement along its respective radial line $O_3$. The pusher plate 31 is slidably guided and confined by a pair of parallel guide rails 32 which are fixed to the turntable 21. The front or radially outer edge 33 of pusher plate 31 is adapted to engage the lowermost lead frame L within the cassette 23 and displace same radially outwardly of the turntable through the respective slot 26. For this purpose, the rear side wall of the cassette 23 has a suitable clearance slot or opening (not shown) for permitting the pusher plate 31 to project therethrough. The pusher plate 31 also has a block 34 which is fixed to and projects downwardly therefrom. This block 34 extends downwardly through an elongated slot 36 which extends radially of the turntable along the line $O_3$. The block 34 is provided with an enlarged portion positioned below the turntable, which enlarged portion has a downwardly facing arcuate groove 37 formed therein. This arcuate groove 37 is generated about the center of rotation $O_1$.

The transfer mechanism 12 also includes a drive device 39 which is designed to cooperate with each of the pusher plates 31 for effecting reciprocation thereof when the respective pusher plate and its associated cassette is disposed in the unloading position directly adjacent the input end of conveyor system 13, as illustrated by FIG. 5. This drive device 39 includes a conventional motor 41 connected through a conventional reduction gear train 42 to a drive shaft 43, the latter being rotatably supported on the frame 22 such that its longitudinal rotational axis $O_4$ extends substantially parallel to the radial line $O_3$ associated with the cassette 23 which is disposed in the unloading position. The drive shaft 43 has a cylindrical cam 44 secured thereto at a location beneath the turntable 21. The drive shaft 43 also projects outwardly to a location disposed radially outwardly of the turntable 21, and has a drive pulley or wheel 46 secured thereto, which wheel 46 is associated with the conveyor system 13 as explained hereinafter. The cylindrical cam 44 has a conventional cam slot or groove 47 extending therearound, which slot has a conventional pin or roller-type cam follower 48 engaged therewith. This cam follower 48 in turn is mounted on a slide 49 which is slidably mounted on a pair of stationary guide rods 51, which rods extend parallel to the axis $O_4$. This slide 49 has a drive pin 52 fixed thereto and projecting upwardly therefrom, which pin 52 is adapted to project into the arcuate slot 37 associated with pusher plate 31 to effect reciprocation of the latter in response to rotation of cylindrical cam 44.

To rotatably index the turntable 21 so as to successively move the cassettes 23 into the dispensing position, there is provided an electric motor 121 (FIG. 7) having its drive gear 122 in meshing engagement with a further drive gear 123 secured to the vertical drive spindle 124 of the turntable. The turntable 21 mounts therebeneath a plurality of lugs or dogs 126 disposed in angularly spaced relationship, there being one dog 126 disposed in association with each of the cassettes 23. When table 21 is rotated so as to move one of the cassettes 23 into the dispensing position, then the dog 126 associated with that cassette moves into engagement with and activates a main control switch 127 as mounted on the frame, which control switch 127 deenergizes the motor 121 and stops the table 21 so that the selected cassette is in the desired dispensing position. Activation of switch 127 also sends a signal to a suitable control 128, such as a valve, which activates a fluid pressure cylinder 129. The latter slidably extends the stop 131 radially inwardly so that its tooth 132 engages the gear 123 and maintains the turntable in a stopped or stationary condition during the unloading of the lead frames from the cassette which is located at the dispensing position. After all of the lead frames have been dispensed from the cassette located at the dispensing position, then a photocell 119 associated with the cassette senses the presence of an enlarged blocklike weight 118 which was originally positioned on top of the stack of lead frames. Sensing of this weight 119 thus indicates that the cassette is now empty, whereupon the photocell 119 transmits an appropriate signal so that motor 121 is again energized to rotatably index table 21 through a selected angular extent until the next filled cassette moves into the dispensing position.

The above-described drive for the turntable is merely exemplary inasmuch as numerous conventional drive mechanisms and controls could be provided for effecting the desired indexing of the table through selected angular increments.

Considering now the conveyor system 13, same includes an inputting conveyor 56 positioned adjacent and substantially tangential to the turntable 21 for receiving thereon the lead frames L which are transferred thereto by the transfer mechanism 12. This inputting conveyor 56 is aligned with and supplies the lead frames to a main conveyor 57, which in turn feeds the lead frames through the blasting chamber 14. This main conveyor 57 in turn supplies the lead frames to a discharging conveyor 58 which is disposed closely adjacent and in substantially tangential relationship to the turntable associated with the removal apparatus 17. These conveyors 56, 57 and 58 are substantially aligned with one another for advancing the lead frames L along directional line $O_5$ which extends substantially tangentially between the spaced rotatable turntables which define the supply and removal apparatus 11 and 17, respectively.

The inputting conveyor 56, as illustrated by FIGS. 3–5, includes an endless conveyor belt or chain 61 having a plurality of driving lugs 62 projecting outwardly therefrom at spaced intervals therealong. This belt 61 is drivingly supported on and extends between the wheels 46 and 63, whereupon the upper reach of this belt 61 is hence disposed tangentially adjacent the periphery of the turntable 21 and substantially flush with the upper surface thereof. An appropriate platform 64 is stationarily disposed adjacent the periphery of the table and defines a support track which includes elongated rails 66 which extend along the conveyor system to enable the lead frame L to be slidably supported therealong. The conveyor lugs 62 are suitably spaced so as to enable one of the lugs to engage the rear edge of the lead frame to drivingly move the latter toward and onto the main conveyor 57.

Figure 8:
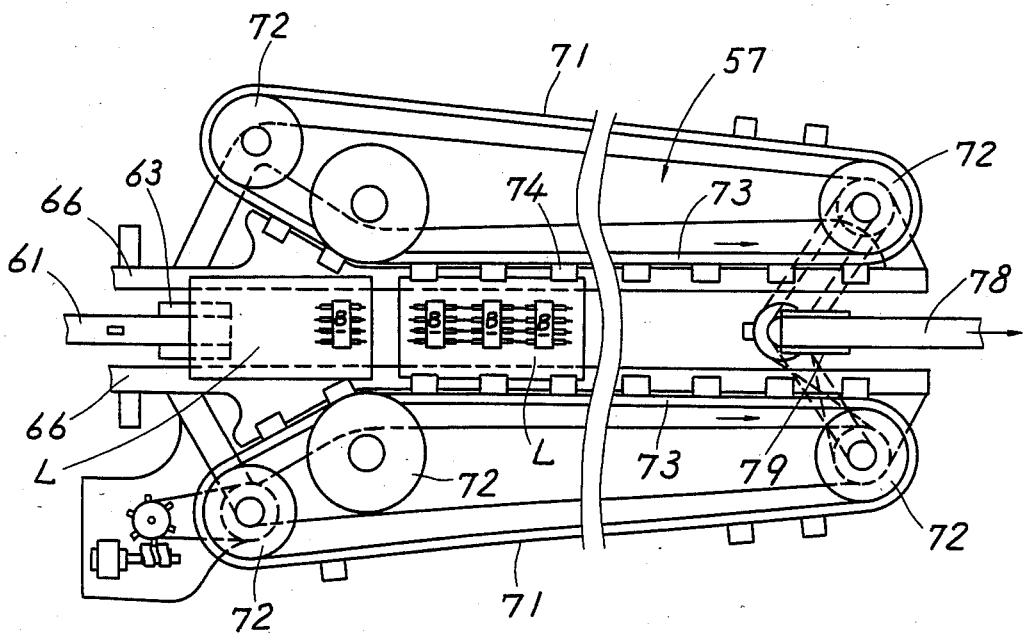
FIG. 8 is a fragmentary top view illustrating the main conveyor which supplies the lead frames through the blasting chamber.
Figure 9:
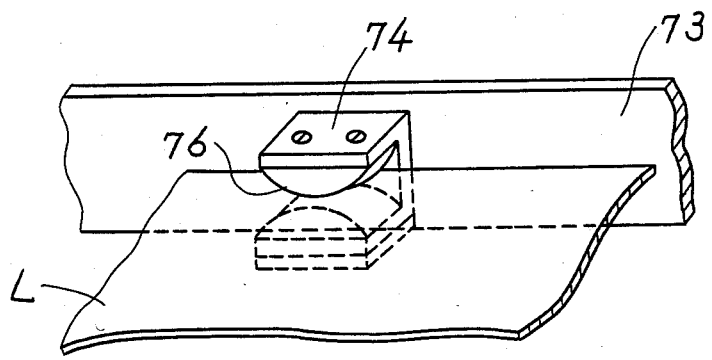
FIG. 9 is an enlarged, fragmentary perspective view illustrating the manner in which the lead frames are supported on the conveyor illustrated by FIG. 8.
Figure 10:
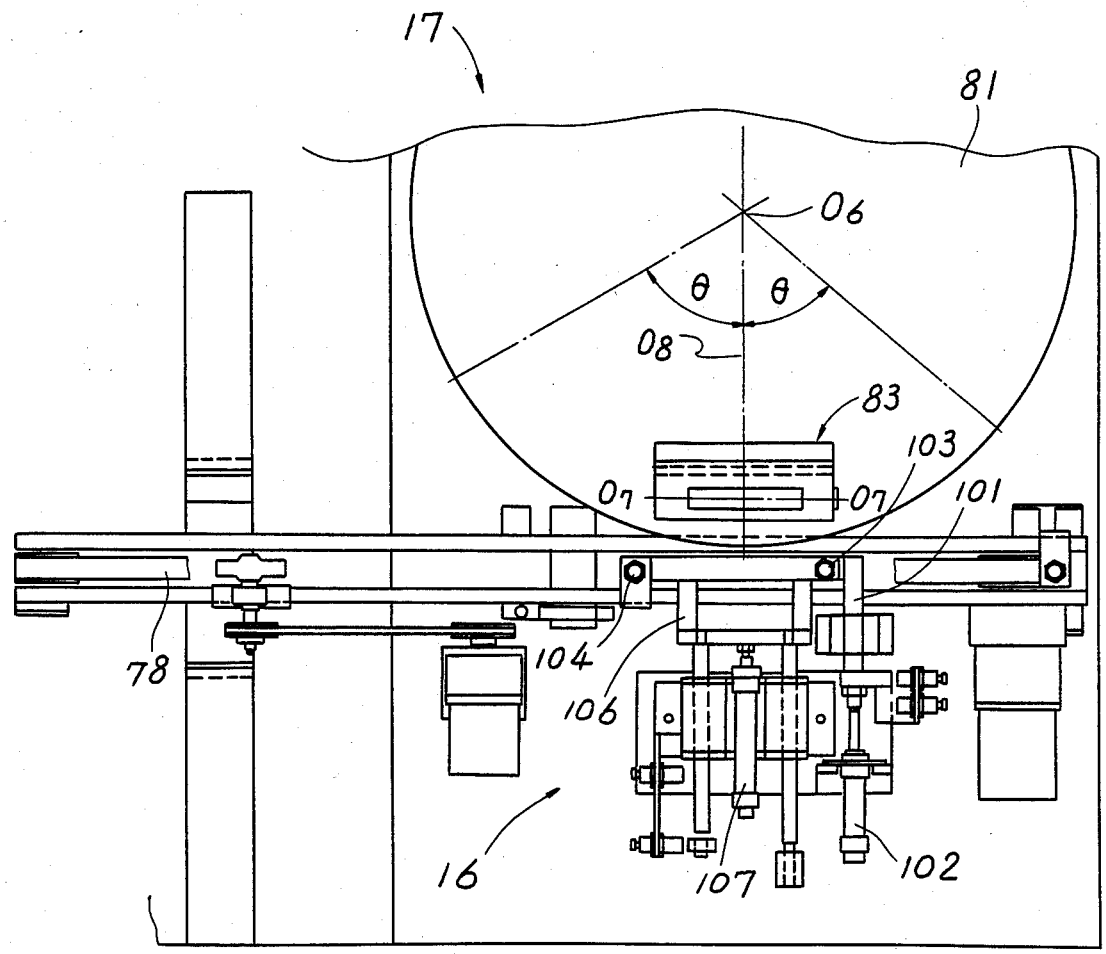
FIG. 10 is a fragmentary top view illustrating the discharge turntable and the transfer mechanism associated therewith.

This main conveyor 57, as illustrated by FIGS. 3 and 8, includes a pair of endless conveyor belts 71 appropriately supported on rotatable pulleys 72 so that the belts 71 hence have a pair of opposed parallel reaches 73 which are horizontally sidewardly spaced relative to the conveying direction. These conveyor belts 71 have outwardly projecting clamps 74 (FIG. 9) provided with elastic pads 76 which define a slit for accommodating the edge of the metal lead frame L therebetween. These conveyor reaches 73 support the lead frame L in a substantially horizontal orientation and convey it substantially horizontally through the blasting chamber 14, in which chamber numerous blasting guns direct appropriate blasting media against the lead frame L so as to remove the undesired resin, namely the burrs and flash. This general type of conveyor 57 for feeding lead frames into and through a blasting chamber is already known, as illustrated by published Japanese patent application No. 53-14596, now Japanese Pat. No. 59-10578.

Considering now the discharging conveyor 58, it is aligned with the main conveyor 57 and includes an endless flat belt 78 which is supported on a pair of spaced pulleys 79 so that the upper reach of belt 78 is oriented substantially horizontally and is positioned closely adjacent and substantially tangential relative to the rotatable turntable of the removal apparatus 17. However, the upper reach of the belt 78 is normally positioned slightly below the upper surface of the turntable of the removal apparatus 17, and this is normally accomplished due to the inputting conveyor 56 being inclined downwardly at a small angle as illustrated by FIG. 4, whereby the remainder of the conveyor belts in the system 13 are hence disposed at an elevation slightly below the elevation of the upper surfaces of the turntables.

As mentioned above, the removal apparatus 17 also includes a horizontally planar turntable 81 which is rotatably supported on a frame for rotation about a central vertical axis $O_6$. This turntable 81 mounts thereon a plurality of cassette units 83 disposed adjacent the periphery of the turntable and equally angularly spaced therearound.

Each cassette unit 83 includes a removable cassette or holder 84 which effectively comprises a vertically elongated tubular member of substantially rectangular cross section having an opening or chamber 86 extending upwardly from the bottom thereof. The chamber 86 is of substantially rectangular cross section sized so as to be only slightly larger than the horizontal rectangular cross section of the lead frame L. The cassette 84 is adapted to be detachably supported on a holder 87 which is fixed to and projects upwardly from the upper surface of the turntable 81. This holder 87 supports the cassette 84 such that the lower edge 88 thereof is spaced upwardly a substantial distance from the upper surface of turntable 81, and the chamber 86 in the cassette is disposed in vertical alignment with a substantially identical rectangular opening 89 which extends vertically through the turntable 81. This latter opening 89 is disposed with its lengthwise extending central axis $O_7$ along a line which is perpendicular to a radial line $O_8$, which radial line passes through the midpoint of the opening 89 and extends substantially perpendicularly with respect to the direction of movement $O_5$ defined by the conveyor system 13.

The holder 87 mounts thereon two pairs of one-way pawls or holding dogs 91 disposed adjacent opposite sides of, and at opposite ends of, the opening 89. These pawls 91 are supported by pivots 92 mounted on the holder 87 and are counterweighted such that the pawls are normally urged in such direction by gravity as to be maintained against the stationary stops 93 fixed to the holder. The opposite ends of the pawls 91 project toward and slightly into the lower end of the cassette chamber 86, and the lower side walls of the cassette 84 are provided with small clearance slots 94 for permitting the ends of the pawls 91 to pass therethrough. These pawls 91 swing away from the stops 93 to permit a lead frame L to be pushed upwardly into the chamber 86, whereupon the pawls 91 then swing back into engagement with the stops 93 so that the other ends of the pawls project under the lead frame and thereby hold the lead frame within the chamber 86.

The lower end of cassette 84 also has a plurality of small openings 96 formed in and extending transversely through the side walls closely adjacent the bottom of the chamber 86, which openings 96 are just below the position of the pawls 91. These openings 96 permit a plurality of support pins 97 to be inserted therethrough, which pins are fixed to a suitable holder 98. This holder 98 is inserted into the cassette to support a plurality of lead frames in vertically stacked relationship therein when a cassette 84 is to be removed from its respective holder 87.

Figure 11:
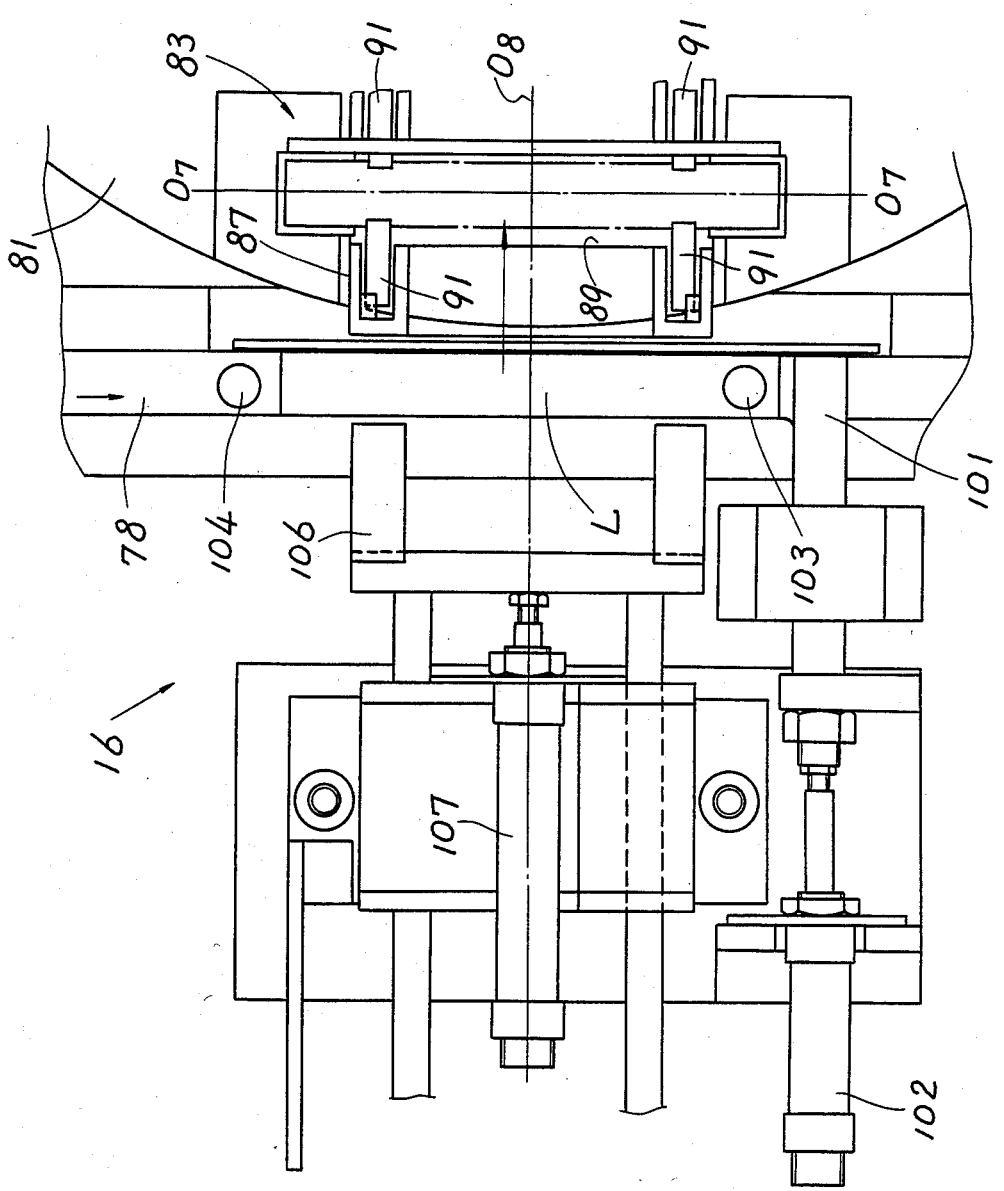
FIG. 11 is an enlarged top view corresponding to a portion of FIG. 10 but illustrating the transfer mechanism rotated 90° in a clockwise direction.
Figure 12:
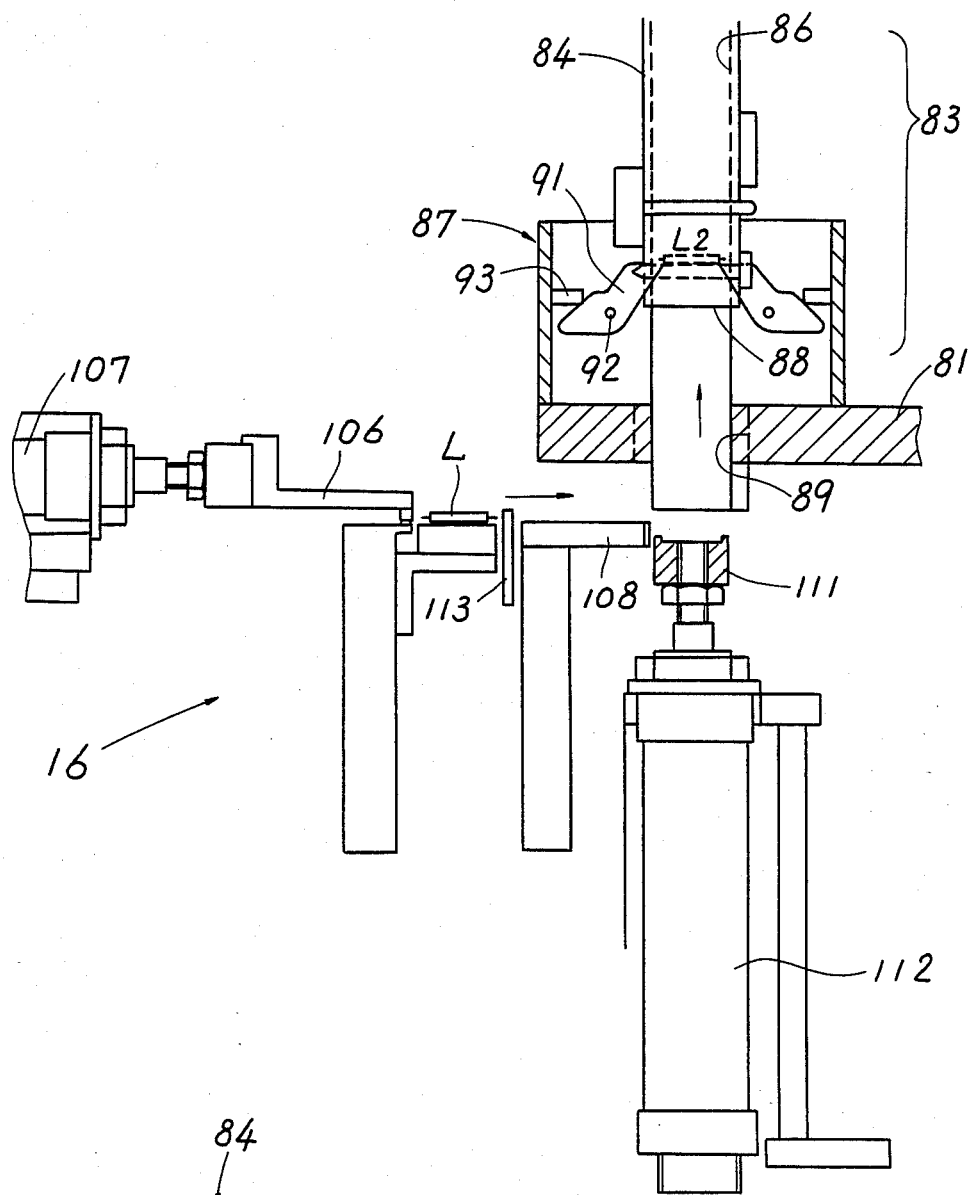
FIG. 12 is a fragmentary sectional elevational view of the transfer mechanism illustrated by FIG. 11.
Figure 13:
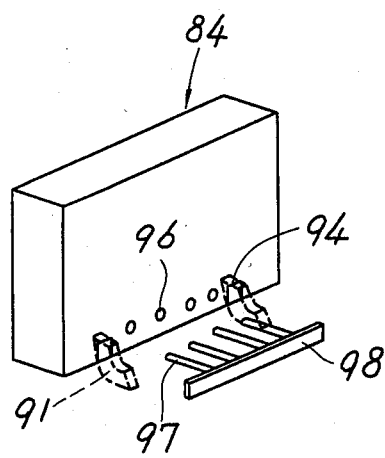
FIG. 13 is a perspective view illustrating the cassette for receiving the finished lead frames.
Figure 14:
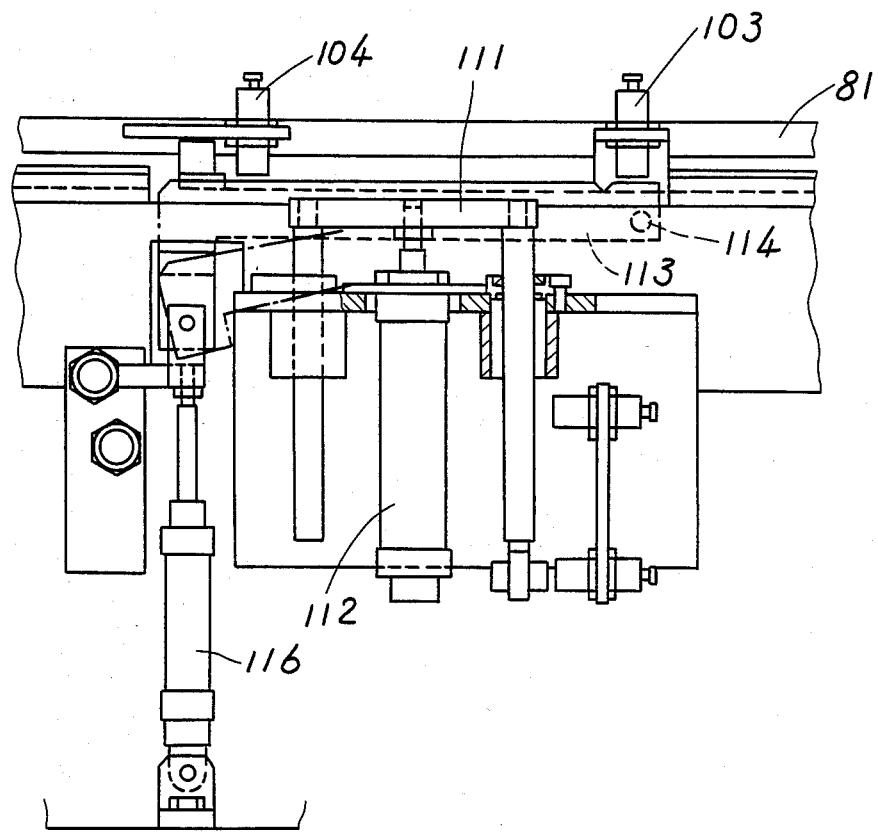
FIG. 14 is an elevational view, partially in cross section, as taken substantially from the front side of FIG. 10.
Figure 15:
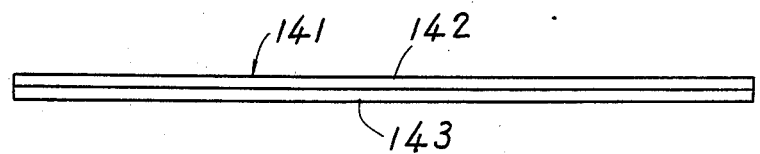
FIG. 15 is a side view of a protective case useable for enclosing the lead frame.
Figure 16:
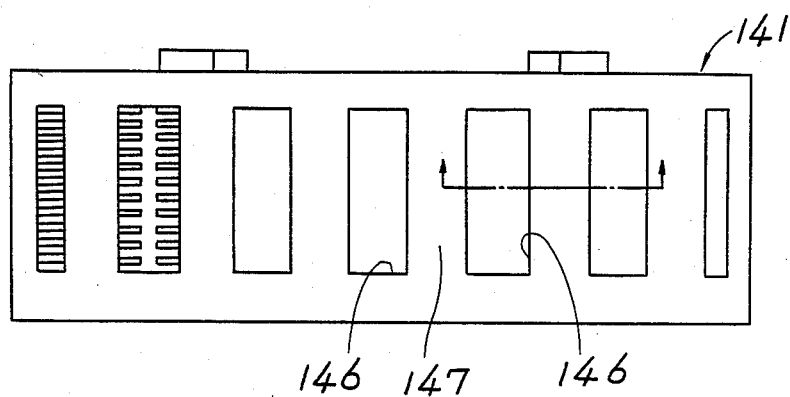
FIG. 16 is a top view of the case shown in FIG. 15.
Figure 17:
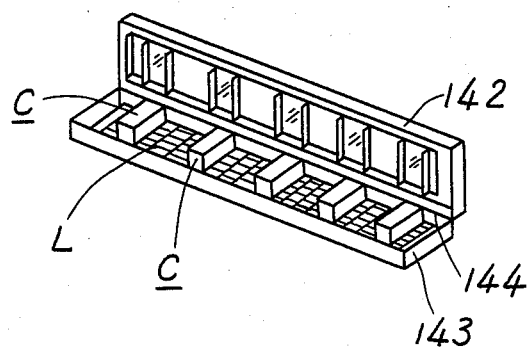
FIG. 17 is an enlarged, fragmentary sectional view taken along XVII—XVII in FIG. 16.
Figure 18:
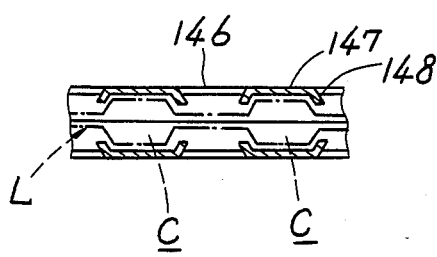
FIG. 18 perspective view illustrating the protective case in an open position and having a lead frame disposed therein.

Considering now the transfer mechanism 16 for transferring lead frames from the discharging conveyor 58 and loading them into a cassette 84 on the removal apparatus 17, this transfer mechanism includes a stop 101 which is normally positioned so as to extend across the upper surface of the upper reach of belt 78 so as to stop the lead frames L which are transported therealong. This stop 101 is connected to the piston rod of a conventional fluid pressure cylinder 102 so that the latter can retract the stop 102 transversely relative to the belt (leftwardly in FIG. 11) to enable the lead frame to continue to move forwardly past the turntable 81 for removal at a separate location if necessary. There is also provided a pair of proximity switches 103 and 104 positioned adjacent but upwardly above the upper reach of conveyor belt 78 for sensing the presence of lead frames L on the conveyor belt. The proximity switch 103 is disposed closely adjacent and just upstream of the stop 101 for sensing when the leading end of a lead frame L moves into position against the stop. The other proximity switch 104 is positioned upstream from the switch 103, and in fact is spaced therefrom by a distance approximately equal to or slightly greater than the length of the lead frame L. This switch 104 is provided for sensing the leading end of the next succeeding lead frame and, if switch 104 senses the next lead frame at the same time switch 103 senses the preceding lead frame, then cylinder 102 is actuated to retract stop 101 so as to permit the frontmost lead frame to pass on by the turntable 81 to prevent the pile-up of lead frames.

To effect the transverse transfer of the lead frames from the conveyor belt 78 to the turntable 81, the transfer mechanism 16 includes a substantially U-shaped pusher 106 disposed directly adjacent the upper reach of conveyor belt 78 at a location directly upstream from the stop 101. This pusher 106 is connected to the piston rod of a conventional double-acting fluid pressure cylinder 107. The pusher 106, when in a retracted position, is normally disposed closely adjacent the outer side of the upper reach of belt 76, and a substantially planar stationary guideway 108 is disposed adjacent the other side of the upper belt reach. Upon energization of the pressure cylinder 107, the pusher 106 is moved forwardly across the upper surface of the upper belt reach so as to engage and sidewardly slide the lead frame L off of belt 78 onto the guideway 108, and across the guideway onto a holder or acceptor 111. This acceptor is secured to the upper end of the piston rod associated with a vertically oriented double-acting fluid pressure cylinder 112. When the cylinder 112 is in its lowermost position, acceptor 111 is disposed at an elevation closely adjacent but slightly below the surface of guideway 108 so that the lead frame L can be pushed off of the guideway onto the acceptor 111. Energization of pressure cylinder 112 causes acceptor 111, and the lead frame L thereon, to move upwardly through the turntable opening 89 until the acceptor moves upwardly past the pawls 91. When the pressure cylinder 112 is retracted downwardly, the pawls 91 engage the lead frame L and hold same within the cassette 84.

To prevent pusher 106 from moving the next lead frame onto the acceptor 111 prior to its returning to its lowermost position, there is provided a vertically extending control plate 113 which is positioned directly between the guideway 108 and the upper reach of conveyor belt 78. This control plate 113 is normally oriented so that it projects upwardly above the upper belt reach to prevent a lead frame from being pushed therefrom by the pusher 106. However, control plate 113 is hinged adjacent one end thereof at 114 and is connected at the other end thereof to the piston rod of a fluid pressure cylinder 116 so that when the latter is retracted, control plate 113 is swung downwardly to permit the lead frame to be slidably displaced sidewardly from the conveyor belt 78 onto the guideway 108.

OPERATION

The operation of the machine 10 will be briefly described to ensure a complete understanding thereof.

As to the supply apparatus 11, the lead frames L are vertically stacked in the cassettes 23, and a suitable weight 118 is positioned on top of each stack. As to the cassette 23 positioned adjacent the inputting conveyor 56, the rotation of cam 44 causes the pusher plate 31 to reciprocate in a cyclic manner radially outwardly and then inwardly, which pusher plate during each cycle engages the lowermost lead frame within the cassette and slides same radially outwardly across the platform 64 for engagement by the conveyor belt 61. During transfer of the lead frame across the platform 64, the lead frame is being moved along its narrow or widthwise direction. The belt 61 then moves the lead frame in its lengthwise or longitudinal direction into engagement with the support clamps 74 associated with the main conveyor 57. The latter moves the lead frame L through the blasting chamber 14A, within which chamber the lead frame is subjected to blasting in a conventional manner so as to remove the flash and burrs. This blasting typically involves the directing of several fluid streams against the lead frame, which fluid streams contain blasting particles such as various abrasive particles or glass beads, and several blasting guns are strategically located within the blasting chamber for directing the blasting media against the lead frame. The blasting media typically utilizes grit such as fine alumina or glass beads, this being a known blasting technique.

The main conveyor 57 then carries the lead frame out of the blasting apparatus and transfers it onto the upstream end of the conveyor belt 78 associated with the discharging conveyor. This conveyor belt in turn carries the lead frame into position adjacent the stop 101. The control plate 113 is lowered, and pusher 106 extended sidewardly (rightwardly in FIG. 11) so as to engage the lead frame and slide it sidewardly off the belt 78 and across the guideway 108 until the lead frame is deposited on the upper end of acceptor 111. The pusher 106 retracts, and pressure cylinder 112 moves acceptor 111 upwardly through the turntable into the lower end of the cassette 84. The width of the lead frame slightly exceeds the spacing between the opposed pawls 91 so that they deflect upwardly to permit the lead frame to pass therethrough, and then move under the lead frame to hold same within the cassette when the acceptor 111 is retracted downwardly into its lowermost position.

The above operation continues until the desired quantity of finished lead frames L are vertically stacked within the cassette 84. The turntable 81 is then rotatably indexed (counterclockwise in FIG. 3) through a selected angular extent until the next empty cassette unit 83 is positioned adjacent the transfer mechanism 16. The cassette unit 83 which was previously filled with lead frames then has the support pins 97 slid through the openings 96 so as to support the stack of lead frames within the cassette 84, following which the filled cassette 84 can be manually removed from the holder 87 and replaced with an empty cassette.

With respect to the transfer mechanism 12, when the pusher 31 removes the last lead frame therefrom, then the weight 118 is disposed lowermost within the cassette 23, and the presence of this weight 118 is sensed by an appropriate device, such as a photocell 119. This hence signals the driving motor for the turntable 21 such that the turntable is then rotatably indexed (clockwise in FIG. 3) through a selected angular extent until the next adjacent filled cassette 23 is disposed in the unloading position adjacent the upstream end of the inputting conveyor 56. During the rotation of turntable 21 so as to move the next cassette into the unloading position, the rotating cylindrical cam 44 is maintained stationary so as to hold the slide 49 and drive pin 52 in their radially innermost positions relative to the axis $O_1$. Rotation of the table 21 hence causes the drive pin 52 to move out of the arcuate groove 37 associated with the pusher plate 31 of the empty cassette, and then move into engagement with the arcuate groove 37 of the pusher plate associated with the next filled cassette as the latter moves into the unloading position.

The machine of this invention hence causes substantially automatic handling of the lead frames, one after another, so as to permit efficient removal of burrs and flash therefrom. At the same time, this machine is of compact size and requires minimum length and floor space, and defines a transfer path for the lead frames which is compact and efficient.

While the process and apparatus has been described in relationship to the blasting of the lead frames L in their entirety by the blasting media, nevertheless the process and apparatus is also applicable in those situations where it is desired to enclose the lead frame L within a suitable case or covering so that only selected areas, such as the leads a and b, will be exposed to the blasting media. Reference is made to FIGS. 15–18 which illustrate therein a case 141 which is particularly suitable for enclosing the lead frame L.

This case 141 includes upper and lower portions 142 and 143, respectively, which are suitable connected together, as by a lengthwise hinge 144. The case 141 defines therein a shallow boxlike compartment which is sized so as to closely accommodate a lead frame L therein. Both the top and bottom walls have a plurality of openings 146 therein which are suitably disposed so as to expose the leads a and b as defined on the lead frame between the adjacent plastic masses c. The top and bottom walls of the case also have suitable protective wall portions 147 disposed between the openings 146, which wall portions 147 preferably terminate in inwardly directed flanges 148. Each wall portion 147 and its associated flanges 148 is adapted to be disposed directly over and substantially surround one of the plastic masses c so as to prevent the blasting media from impinging thereagainst, while at the same time the openings 146 permit the blasting media to directly contact the leads a and b and remove the undesired flash and burrs, such as at d (see FIG. 2). When the case 141 is utilized to protectively enclose the lead frame L, then the lead frames are positioned and enclosed within the protective cases 141 prior to the stacking of the lead frames within the supply cassettes 23, following which the process and apparatus of this invention operates in the same manner as above described.

Although a particular preferred embodiment of the invention has been disclosed in detail for illustrative purposes, it will be recognized that variations or modifications of the disclosed apparatus, including the rearrangement of parts, lie within the scope of the present invention.

The embodiments of the invention in which an exclusive property or privilege is claimed are defined as follows:

1. A machine for finishing electronic devices, such as lead frames for integrated circuit chips, comprising:

supply means for said electronic devices including a substantially horizontal turntable rotatable about a substantially vertical axis, and a plurality of upright cassettes mounted on said turntable adjacent the periphery thereof, said cassettes being disposed in uniformly angularly spaced relationship on said turntable relative to said axis, each of said cassettes defining a vertically oriented chamber adapted to support therein a plurality of electronic devices disposed in vertically stacked relationship, the chamber having an elongated rectangular cross-section corresponding to the size of the electronic devices, the chamber having its elongate dimension extending generally in the peripheral direction of the turntable;

horizontally elongated transfer means extending from a first location disposed tangentially adjacent said turntable to a second location for permitting individual electronic devices to be moved away from said turntable, said transfer means including conveyor means for effecting movement of individual electronic devices in an elongated direction thereof along a substantially straight path of movement which extends substantially tangentially of said turntable between said first and second locations;

abrasive-particle blasting means associated with said transfer means at a third location disposed intermediate said first and second locations for subjecting said electronic devices to a blasting media, said blasting means including a housing defining therein a blasting chamber, and gun means within said chamber for directing a fluid-abrasive particle stream against said electronic devices;

said conveyor means including an elongate endless main conveyor which extends horizontally through the blasting chamber for individually transporting the electronic devices therethrough, said main conveyor including a pair of endless conveyor elements having inner reaches which are disposed in generally parallel but sidewardly spaced relationship for individually horizontally supporting said electronic devices therebetween, said endless conveyor elements having means thereon for supportingly engaging solely opposite longitudinally extending edges of the electronic devices so that upper and lower surfaces of the electronic devices are exposed as they travel through the blasting chamber; and a transfer mechanism associated with said first location for individually and sequentially removing a lowermost electronic device from the cassette as disposed at a dispensing position adjacent said first location by moving said lowermost electronic device radially outwardly of said turntable along a direction which generally parallels a shorter width dimension of the electronic device until the device is deposited onto the upstream end of said transfer means at said first location;

said transfer mechanism including a plurality of ejector units movably mounted on said turntable, one of said ejector units being associated with each of said cassettes, said transfer mechanism also including drive means drivingly coupled to solely the ejector unit disposed in said dispensing position for actuating same to cause sequential discharge of the electronic devices from said cassette as disposed in said first location, said ejector unit including a pusher member slidably supported on said turntable for reciprocal displacement radially thereof, said pusher member being disposed closely adjacent and radially inwardly from the respective said cassette, said cassette having guide slot means adjacent the lower end thereof for permitting said pusher means to slide radially outwardly relative to said turntable into the lower end of the respective cassette for ejecting the lowermost electronic device sidewardly from the cassette radially outwardly of said turntable into engagement with said transfer means.

2. An apparatus for handling electronic devices, such as lead frames for integrated circuit chips, comprising:

indexing turntable means supported for rotation about a substantially vertical axis;

a plurality of cassettes mounted on said turntable means in radially spaced relationship from and substantially uniformly angularly spaced around said vertical axis, each cassette defining a vertically extending chamber for permitting a plurality of electronic devices to be supported therein in vertically stacked relationship;

driving means coupled to said turntable means for angularly displacing the turntable means in an indexing manner through selected angular increments to sequentially position one of said cassettes at a preselected location; and a transfer mechanism for individually and sequentially removing electronic devices from the cassette as disposed at said preselected location and transferring the removed electronic device radially outwardly of the turntable means to a transfer position disposed radially outwardly thereof;

said transfer mechanism including a plurality of ejector units movably mounted on said turntable, one of said ejector units being associated with each of said cassettes, said transfer mechanism also including drive means drivingly coupled to solely the ejector unit disposed in said preselected location for actuating same to cause sequential discharge of the electronic devices from said cassette as disposed in said preselected location;

said ejector unit including a pusher member slidably supported on said turntable for reciprocal displacement radially thereof and a driven portion coupled to said pusher member, said pusher member being disposed closely adjacent and radially inwardly from the respective said cassette, said cassette having guide slot means adjacent the lower end thereof for permitting said pusher member to slide radially outwardly relative to said turntable into the lower end of the respective cassette for ejecting the lowermost electronic device sidewardly from the cassette radially outwardly of said turntable into said transfer position;

said drive means including a drive portion which is releasably engaged only with the driven portion of the ejector unit disposed in said preselected location.

* * * * *